United States Patent
Cho

(10) Patent No.: US 7,818,697 B2
(45) Date of Patent: Oct. 19, 2010

(54) METHOD FOR IMPROVING YIELD OF A LAYOUT AND RECORDING MEDIUM HAVING THE LAYOUT

(75) Inventor: Dae Hyung Cho, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 472 days.

(21) Appl. No.: 11/822,997

(22) Filed: Jul. 11, 2007

(65) Prior Publication Data

US 2008/0046847 A1    Feb. 21, 2008

(30) Foreign Application Priority Data

Aug. 19, 2006    (KR) ...................... 10-2006-0078456

(51) Int. Cl.
*G06F 17/50* (2006.01)
(52) U.S. Cl. .......................................................... 716/4
(58) Field of Classification Search ...................... 716/4, 716/5
See application file for complete search history.

(56) References Cited

U.S. PATENT DOCUMENTS

| | | | |
|---|---|---|---|
| 6,507,930 B1 * | 1/2003 | Bass et al. | 716/2 |
| 6,901,564 B2 | 5/2005 | Stine et al. | |
| 7,076,749 B2 * | 7/2006 | Kemerer et al. | 716/4 |
| 2001/0049811 A1 | 12/2001 | Taoka | |

FOREIGN PATENT DOCUMENTS

| | | |
|---|---|---|
| JP | 2001-350250 | 12/2001 |
| JP | 2004-127067 | 4/2004 |

\* cited by examiner

*Primary Examiner*—Jack Chiang
*Assistant Examiner*—Brandon W Bowers
(74) *Attorney, Agent, or Firm*—Lee & Morse, P.C.

(57) ABSTRACT

A yield of a semiconductor layout may be improved by selecting a pattern that does not satisfy at least one of multiple rules within the layout, adding a margin to a predetermined value of the at least one of the rules associated with selected pattern, based on a ground rule and a recommended rule of each of the rules, calculating an overall fail rate of at least one of the rules that varies according to the addition of the margin, and determining an adjusted margin to be added based on the calculated overall fail rate.

12 Claims, 5 Drawing Sheets

FIG. 4

| NO. | Rules | GR(μm) | RR(μm) |
|---|---|---|---|
| 1 | Metal width | 0.13 | 0.15 |
| 2 | Metal space | 0.13 | 0.15 |
| 3 | Metal overlap of Contact | 0.0 | 0.05 |
| 4 | Poly overlap of Contact | 0.05 | 0.08 |
| 5 | Poly space to Active | 0.05 | 0.09 |

FIG. 5

| Metal width | RANGE(μm) | FR(ppb) |  |
|---|---|---|---|
|  | 0.13 | 0.0002 | ~ W1 |
|  | 0.14 | 0.00005 | ~ W2 |
|  | 0.15 | 0 | ~ W3 |

| Metal space | RANGE(μm) | FR(ppb) |  |
|---|---|---|---|
|  | 0.13 | 0.0005 | ~ S1 |
|  | 0.14 | 0.0001 | ~ S2 |
|  | 0.15 | 0 | ~ S3 |

| Metal overlap of Contact | RANGE(μm) | FR(ppb) |  |
|---|---|---|---|
|  | 0.0 | 0.001 | ~ C1 |
|  | 0.01 | 0.0005 | ~ C2 |
|  | 0.02 | 0.00012 | ~ C3 |
|  | 0.03 | 0.00008 |  |
|  | 0.04 | 0.00001 |  |
|  | 0.05 | 0 |  |

| Poly overlap of Contact | RANGE(μm) | FR(ppb) |
|---|---|---|
|  | 0.05 | 0.0008 |
|  | 0.06 | 0.0003 |
|  | 0.07 | 0.00008 |
|  | 0.08 | 0 |

METHOD FOR IMPROVING YIELD OF A LAYOUT AND RECORDING MEDIUM HAVING THE LAYOUT

BACKGROUND OF THE INVENTION

1. Field of the Invention

The present embodiments relate to a method for improving a yield of semiconductor integrated circuits (ICs). More particularly, the present embodiments relate to a method for improving a yield of a semiconductor IC by adding a margin to a metal pattern, a poly (polysilicon) pattern, or an active pattern of a layout of the semiconductor IC, and a recording medium having the method recorded thereon.

2. Description of the Related Art

A semiconductor layout may be designed based on rules associated with each of multiple patterns. Each of the rules may play an important role in arranging the corresponding pattern within a semiconductor layout.

Each of the rules may be based on a ground rule (GR) measured in a manufacturing part. The GR is also referred to as a minimum rule, and may correspond to a minimum value of each of rules associated with a metal pattern, a poly pattern, and an active pattern.

When a computer or a user designs a pattern within a layout of a semiconductor IC, if a value, e.g., a pattern width, of the rule associated with the pattern is designed to be smaller than the value of the GR, a defective semiconductor IC may be generated.

With current developments in semiconductor IC layout technology, a design of multiple patterns may be conducted with associated rules having values of sub-microns or less, and thus it may be difficult to obtain a satisfactory yield by only using the GR.

A recommended rule (RR) obtained by adding a predetermined margin to the GR may thus be proposed. When the RR is applied to the values of rules associated with patterns, the layout of the semiconductor IC may provide a better yield. The RR may allow the fail rate of a layout to be "0", so that when the RR is applied to each of the rules, the yield of the layout may be maximized.

However, when the RR is applied to each of the rules, the size of the layout may increase. When the values of the rules in the layout having a predetermined size are greater than the values of the RR, it may be difficult to integrate the patterns into the semiconductor IC.

A method for improving the yield of semiconductor ICs may divide a layout pattern designing rule into the GR and the RR, and then design patterns of a layout so as to satisfy the RR. A processor or a user may calculate a percentage of patterns that satisfy the RR within all patterns within the layout, and may also calculate a threshold value that is a minimum percentage of times the RR may be satisfied with the patterns. When a percentage of occasions when the RR was satisfied is greater than or equal to the threshold value, the processor or user may determine the corresponding patterns to have passed, and the layout may be designed with these patterns. When the percentage of occasions the RR was satisfied is less than the threshold value, the processor or user may determine the corresponding patterns to have failed, and the patterns may be corrected so as to satisfy the RR. However, the rule associated with the pattern is divided into the GR and the RR, and it may be difficult to apply the RR to a rule having a large difference between the GR value and the RR value because the fixed size of the layout.

In addition, the processor or user may have difficulty in setting a standard for determining the threshold value, and when a percentage of patterns that satisfy the RR is less than the threshold value, the patterns may not be able to be corrected because the space of the layout may be insufficient.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present embodiments are therefore directed to a method for improving the yield of a layout, which substantially overcomes one or more of the problems due to the limitations and disadvantages of the related art.

It is therefore a feature of an embodiment of the present invention to provide a method for improving the yield of a layout by adding a margin to rules associated with a metal pattern, a poly pattern, or an active pattern based on the overall fail rate of the patterns.

It is therefore another feature of an embodiment of the present invention to provide a recording medium having recorded the method for improving the yield of the layout thereon.

At least one of the above and other features and advantages of the present invention may be realized by providing a method for improving a yield of a layout, which may include selecting a pattern that does not satisfy at least one of multiple rules of the layout, adding a margin to a predetermined value of the at least one of the rules of the selected pattern, based on a ground rule and a recommended rule of the at least one of the rules, calculating an overall fail rate of at least one of the rules that varies according to the addition of the margin, and determining the adjusted margin to be added based on the calculated overall fail rate.

The pattern may be automatically selected by a computer processor or manually selected by a user. The selecting of the pattern may include determining a range of the margin that is to be added to the predetermined value for the at least one of the multiple rules of the selected pattern based on the ground rule and the recommended rule of each of the rules. The calculating of the overall fail rate and determining of the adjusted margin may include calculating a fail rate of the at least one of the plurality of rules that varies according to the addition of the margin, calculating the overall fail rate based on the fail rate of the at least one rule, and adding the margin in minimal grid units to the value of the at least one rule when the overall fail rate is decreased from an overall fail rate of the rules to which the margin has not yet been added, and determining as the adjusted margin to be added a margin added before an initial increase of the overall fail rate when the overall fail rate is increased from the overall fail rate of the rules to which the margin has not yet been added. The method may further include repeatedly adding the margin in the minimal grid units to the value of the at least one rule until the overall fail rate initially increases. Each of the rules may be at least one of a pattern width, a pattern space, a space between one edge of an overlap and the pattern, a space between a poly region and the pattern, or a space between a poly region and an active region. When the rule is the pattern width, the recommended rule may be about 0.15 μm, and the ground rule may be about 0.13 μm. When the rule is the pattern space, the recommended rule may be about 0.15 μm, and the ground rule may be about 0.13 μm. When the rule is the space between one edge of an overlap and the pattern, the recommended rule may be about 0.05 μm, and the ground rule may be about 0.0 μm. When the rule is the space between a poly region and the pattern, the recommended rule may be about 0.08 μm, and the ground rule may be about 0.05 μm. When the rule is the space between a poly region and an active region, the recommended rule may be about 0.09 μm, and the ground rule may be about 0.05 μm. A recording medium may have recorded thereon a computer program for the method.

At least one of the above and other features and advantages of the present invention may be realized by providing a method for improving a yield of a layout, which may include selecting a pattern that does not satisfy at least one of a plurality of rules within the layout, determining whether the rules associated with the selected pattern have a space to add a margin, determining a range of the margin to be added to the value of at least one rule, ascertaining the types of rules associated with the selected pattern, differentiating the rules into rules having increasing values and rules having decreasing values with the margin is added to a rule that does not satisfy a recommended rule, adding the margin to a predetermined value of the at least one of the plurality of rules associated with selected pattern, based on a ground rule and the recommended rule of each of the plurality of rules, calculating an overall fail rate of at least one of the plurality of rules that varies according to the addition of the margin, and determining an adjusted margin to be added based on the calculated overall fail rate.

The pattern may be automatically selected by a computer processor or manually selected by a user. The selecting of the pattern may include determining a range of the margin to be added to the predetermined value for the at least one of the multiple rules of the selected pattern based on the ground rule and the recommended rule of each of the rules. The calculating of the overall fail rate and determining of the adjusted margin may include calculating a fail rate of the at least one of the plurality of rules that varies according to the addition of the margin, calculating the overall fail rate based on the fail rate of the at least one rule, and adding the margin in minimal grid units to the value of the at least one rule when the overall fail rate is decreased from an overall fail rate of the rules to which the margin has not yet been added, and determining as the adjusted margin to be added a margin added before an initial increase of the overall fail rate when the overall fail rate is increased from the overall fail rate of the rules to which the margin has not yet been added. The method may further include repeatedly adding the margin in the minimal grid units to the value of the at least one rule until the overall fail rate initially increases. Each of the rules may be at least one of a pattern width, a pattern space, a space between one edge of an overlap and the pattern, a space between a poly region and the pattern, or a space between a poly region and an active region. When the rule is the pattern width, the recommended rule may be about 0.15 μm, and the ground rule may be about 0.13 μm. When the rule is the pattern space, the recommended rule may be about 0.15 μm, and the ground rule may be about 0.13 μm.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 4 illustrates a table of a GR and a RR of each of the rules shown in FIG. 3; and FIG. 5 illustrates a fail rate according to an addition of a margin to each of the rules shown in FIG. 4.

DETAILED DESCRIPTION OF THE INVENTION

Figure 1:
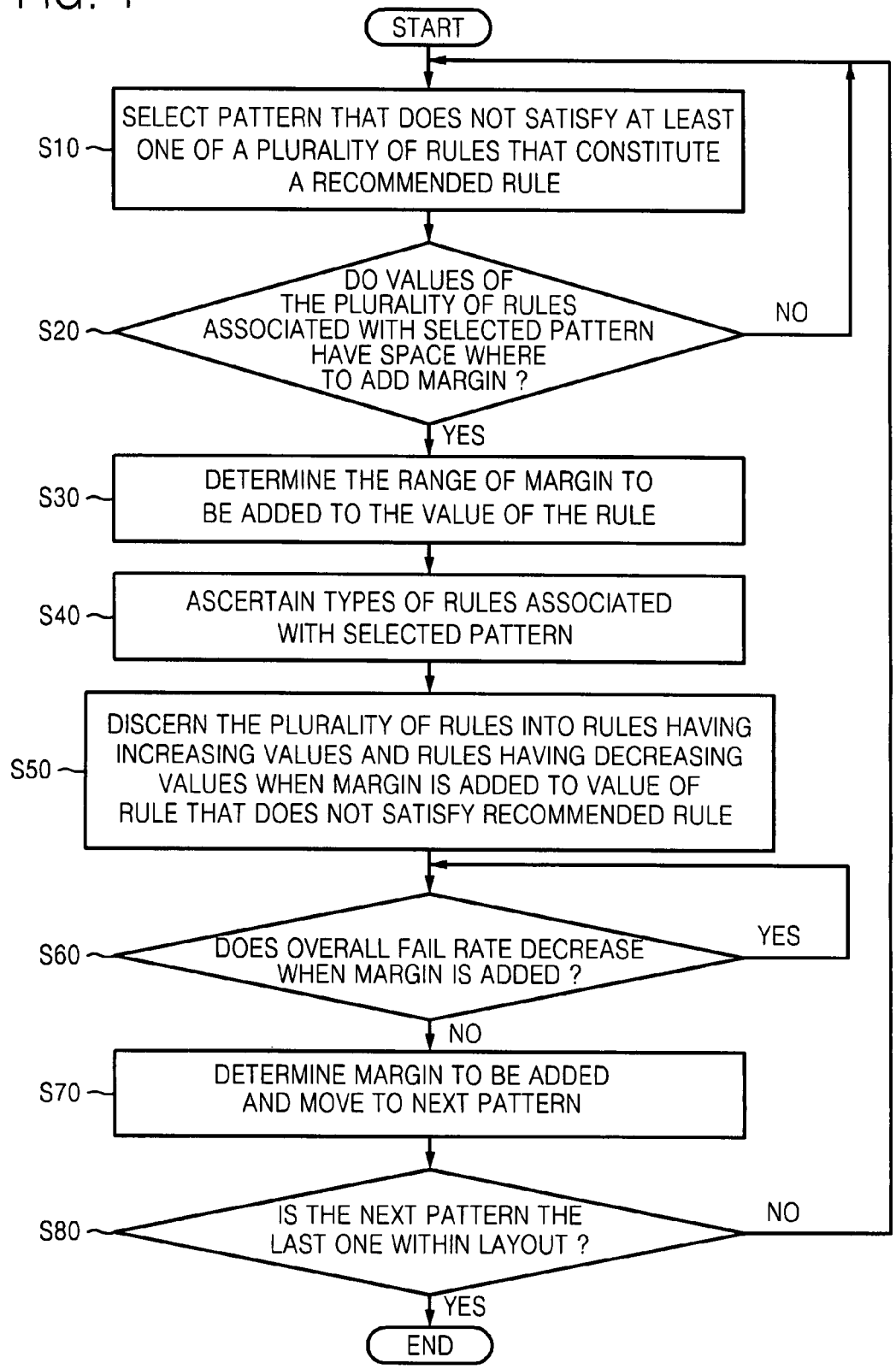
FIG. 1 illustrates a flowchart of a method for improving a yield of a layout.

Korean Patent Application No. 10-2006-0078456, filed on Aug. 19, 2006, in the Korean Intellectual Property Office, and entitled: "Method for Improving Yield of Layout and Recording Medium Having the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In a method for improving the yield of a layout according to the present embodiments, and in a recording medium containing the layout, there may be a large difference between a GR and an RR, and thus even when it may be difficult to apply the RR, an appropriate margin may added to a predetermined value of a rule associated with a pattern, which thereby may improve the yield of the layout.

In addition, a margin that allows the fail rate of all of the patterns of the layout to be minimal may be determined as the margin to be added, whereby the overall fail rate of the layout may be minimized.

Moreover, the method for improving the yield of a layout and the recording medium containing the method may be used as a paradigm of a computer process or a user, such that a margin for improving the yield of the layout may be determined based on not user's experiences but via a logical calculation.

Figure 2:
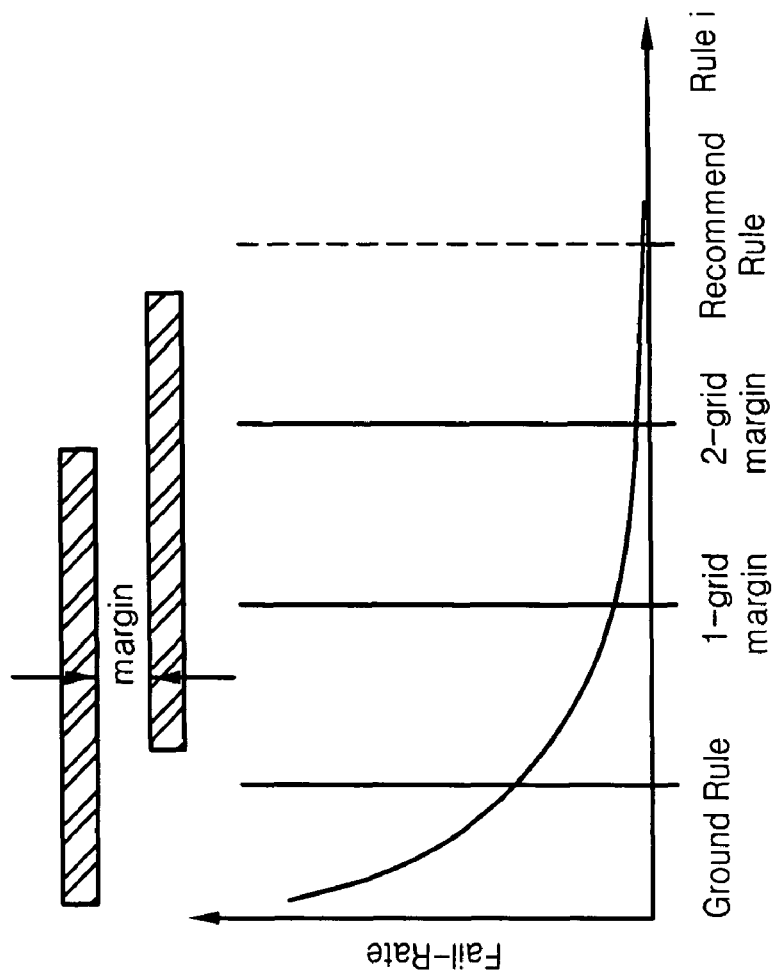
FIG. 2 illustrates a graph of a fail rate according to a margin.

FIG. 1 illustrates a flowchart of a method for improving a yield of a layout. FIG. 2 illustrates a graph showing a fail rate according to a margin.

Referring to FIGS. 1 and 2, in operation S10, a computer processor or a user may select a pattern that does not satisfy at least one of a plurality of rules that constitute a RR within the layout. In operation S20, the computer processor or user may determine whether values of a plurality of rules associated with the selected pattern have a space to add a margin.

In operation S20, when it is determined that no spaces to add the margin exist within the value of the rule associated with the selected pattern, the computer or user may re-perform operation S10. When it is determined that a space to add the margin exists within the value of the rule associated with the selected pattern, the computer processor or user may determine the range of the margin to be added to the value of the rule, in operation S30.

The range of the margin may be between the GR value and the RR value of the rule, and the margin in the range may be added to the rule. In operation S40, the computer processor or user may ascertain the types of rules associated with the selected pattern. Each of the rules may be at least one of a pattern (metal) width, a pattern (metal) space, a space between one edge of the (metal) overlap and the pattern, a space between one edge of the (poly) overlap and the pattern, and a space between a poly region and an active region.

In operation S50, when a margin is added to a predetermined value of a rule that fails to satisfy the RR, the computer processor or user may differentiate the multiple rules associated with the selected pattern into rules having increasing values and rules having decreasing values. In operation S60, the computer processor or user may determine whether when a margin is added to a predetermined value of at least one of the plurality of rules associated with the selected pattern in units of minimum grids, so that the overall fail rate of the layout may decrease.

The fail rate may be represented in units of ppb (parts per billion). As shown in the graph of FIG. 2, a margin in units of minimum grid (for example, 1-grid) may increase from about 0 to the RR value, and the fail rate may decrease to a log scale.

When the predetermined value for the rule satisfies the RR, the fail rate may be considered to be about 0.

The overall fail rate may be obtained by adding a fail rate for the value of the at least one rule that varies according to the addition of the margin. The fail rate may be calculated by the computer or the user.

In operation S60, when it is determined that the overall fail rate has been reduced after the addition of the margin, the computer processor or user may re-perform operation S60. When it is determined in operation S60 that the overall fail rate has been increased after the addition of the margin, the computer processor or user may determine, as an adjusted margin to be added, the margin added before the initial increase of the overall fail rate and move to the next pattern, in operation S70.

In operation S70, after the computer processor or user determines the adjusted margin to be added and moves to the next pattern, it may be determined whether the next pattern is the last one within the layout, in operation S80. In operation S80, when it is determined that the next pattern is not the last one within the layout, the computer processor or user may re-perform operation S10. When it is determined in operation S80 that the next pattern is the last one within the layout, the computer processor or user may conclude the method for improving the yield of the layout.

Figure 3:
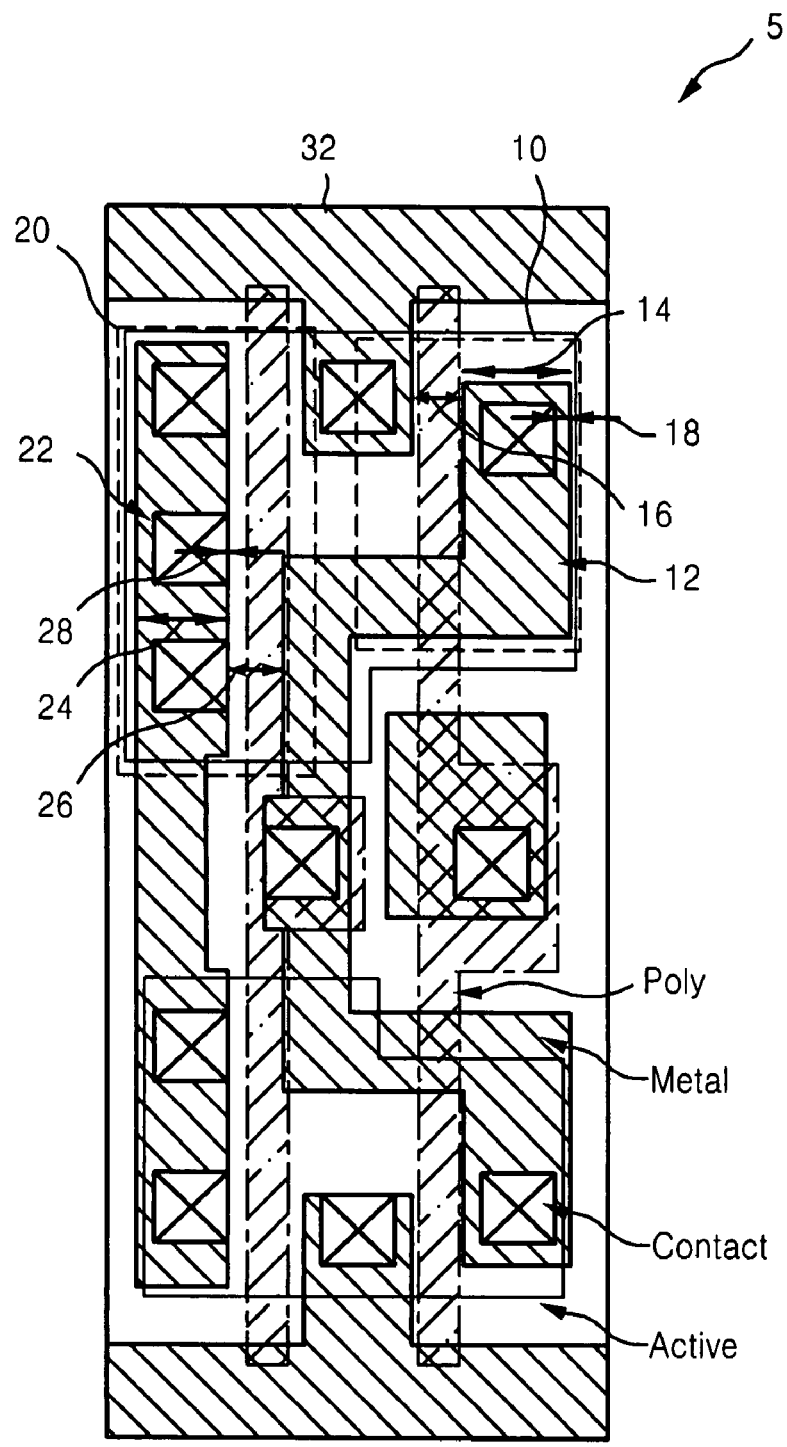
FIG. 3 illustrates a layout of a semiconductor.

FIG. 3 illustrates a layout 5 of a semiconductor IC. Referring to FIG. 3, the semiconductor IC may include a poly pattern Poly, a metal pattern Metal, contacts Contact and an active pattern Active. The various patterns may be juxtaposed on each other in different layering configurations.

FIG. 4 illustrates a table of a GR and an RR of each of the rules shown in FIG. 3.

The table of FIG. 4 may include rules for metal width, metal space, metal overlap of Contact, poly overlap of Contact and poly space to Active.

FIG. 5 illustrates a table of fail rate according to an addition of a margin to each of the rules shown of FIG. 4. The table of FIG. 5 may include sub-tables for metal width, metal space, Metal overlap of Contact, and Poly overlap of Contact.

Referring to FIGS. 1, 3, and 4, in operation S10, the computer processor or user may select the pattern that does not satisfy the at least one of the plurality of rules that constitute the RR within the layout 5.

A first area 10 of the layout 5 may include two metal patterns 12 and 32. When determining whether each of a plurality of rules associated with metal pattern 12 satisfies the RR, the rules may include a pattern width 14, a pattern space 16, and a space 18 between one edge of an overlap and a pattern.

When the pattern width 14 is about 0.16 μm, the pattern space 16 may be about 0.15 μm, and the space 18 between the one edge of the overlap and the pattern may be about 0.05 μm (i.e., No. "4" of FIG. 4). Since the pattern width 14, being about 0.16 μm, may be greater than the RR value (i.e., No. "1" of FIG. 4) of about 0.15 μm of the pattern width 14, the pattern width 14 may satisfy the RR. Since the pattern space 16, being about 0.15 μm, is greater than the RR value (i.e., No. "2" of FIG. 4) of about 0.15 μm of the pattern space 16, the pattern space 16 may be set to conform to the RR.

Since the space 18 between the one edge of the overlap and the pattern, being about 0.05 μm, may be equal to the RR value (i.e., No. "3" of FIG. 4) of about 0.05 μm of the space 18 between the one edge of the overlap and the pattern, the space 18 between the one edge of the overlap and the pattern may satisfy the RR. All of the pattern width 14, the pattern space 16, and the space 18 between the one edge of the overlap and the pattern, which may correspond to the rules associated with the metal pattern 12, may satisfy the RR. When the rule is the space between the poly pattern Poly and the active pattern Active (i.e. No. "5" of FIG. 4), the recommended rule may be about 0.09 μm, and the ground rule may be about 0.05 μm.

A second area 20 of the layout 5 may include three metal patterns 12, 22, and 32. When determining whether each of a plurality of rules associated with metal pattern 22 satisfies the RR, the rules may be a pattern width 24, a pattern space 26, and a space 28 between one edge of an overlap and a pattern. The pattern width 24 maybe about 0.17 μm, the pattern space 26 may be about 0.15 μm, and the space 28 between the one edge of the overlap and the pattern may be about 0.0 μm. The space 28 may also be about 0.0001 μm.

Since the pattern width 24, being about 0.17 μm, may be greater than the RR value (i.e., No. "1" of FIG. 4) of about 0.15 μm of the pattern width 24, the pattern width 24 may satisfy the RR. Since the pattern space 26, being about 0.15 μm, may be equal to the RR value (i.e., No. "2" of FIG. 4) of about 0.15 μm of the pattern space 26, the value of the pattern space 26 may be set to conform to the RR.

Since the space 28 between the one edge of the overlap and the pattern, being about 0.0 μm, may be smaller than the RR value (i.e., No. "3" of FIG. 4) of about 0.05 μm of the space 28, the space 28 may fail to satisfy the RR. Since the space 28 among the rules associated with the metal pattern 22 may not satisfy the RR, the computer processor or user may select the metal pattern 22, in operation S10.

In operation S20, the computer processor or user may determine whether a space available to add a margin exists within the values of the plurality of rules associated with the selected pattern. The computer processor or user may select the metal pattern 22 in operation S10, and the computer processor or user determine whether a space to add the margin exists within the space 28 between the one edge of the overlap and the pattern. When the margin is added to the space 28 of the metal pattern 22, a right edge of the metal pattern 22 may move to the other metal pattern 12.

The pattern space 26 may decrease as the right edge of the metal pattern 22 moves to the right side. The pattern space 26 may be reduced to the GR value (i.e., No. "2" of FIG. 4) of about 0.13 μm because the RR may be about 0.15 μm. Each of the metal pattern 22 and the rules 24, 26, and 28 may thus have a space available to add a margin. Since the value of each rule associated with the metal pattern 22 has a space available to add a margin, the computer processor or user may determine the range of the margin to be added to the value of the rule, in operation S30. The range of the margin may be between the GR and RR values of the rule, and a margin in the range may be added to the rule.

The pattern space 26 corresponding to one of the rules associated with the metal pattern 22 may be about 0.15 μm, and the GR value (i.e., No. "2" of FIG. 4) of the pattern space 26 may be about 0.13 μm. Thus, an about 0.02 μm margin may be applied to the pattern space 26.

In operation S40, the computer processor or user may ascertain the type of each of the rules associated with the selected pattern. The rules associated with the metal pattern 22 may be at least one rule that varies as the right edge of the metal pattern 22 moves to the right side, and may include the pattern width 24, the pattern space 26, and the space 28 between the one edge of an overlap and the pattern.

In operation S50, when the margin is added to the predetermined value for the rule that fails to satisfy the RR, the computer processor or user may distinguish the rules associated with the selected pattern into rules having increasing values and rules having decreasing values. When the margin is added to the space 28 of the metal pattern 22, the right edge of the metal pattern 22 may move to the other metal pattern 12. The rules having increasing values may be the pattern width 24 and the space 28 between the one edge of the overlap and the pattern, and the rule having a decreasing value may be the pattern space 26.

In operation S60, the computer processor or user may determine whether when the margin is added to the predetermined value for the at least one of the plurality of rules associated with the selected pattern in units of minimum grids, if the overall fail rate of the layout may decrease. When the right edge of the metal pattern 22 moves to the right side in units of minimal grids (e.g., about 0.01 μm), the pattern width 24 may increase from about 0.17 μm to about 0.18 μm. Thus, since the pattern width 24 is greater than about 0.15 μm, it may be greater than the RR value (e.g., No. "1" of FIG. 4), and the fail rate of the pattern width 24 may be about 0 (i.e., W3 of FIG. 5).

The pattern space 26 may decrease from about 0.15 μm to 0.14 μm. Thus, when the pattern space 26 is about 0.15 μm, the fail rate thereof may be about 0 (i.e., S3 of FIG. 5), and when the pattern space 26 is about 0.14 μm, the fail rate thereof may be about 0.0001 (i.e., S2 of FIG. 5). Consequently, the fail rate of the pattern space 26 may have increased by about 0.0001. The space 28 between the one edge of the overlap and the pattern may increase from about 0.0 μm to about 0.01 μm.

Accordingly, when the space 28 between the one edge of the overlap and the pattern is about 0.0 μm (or about 0.0001 μm), the fail rate thereof may be about 0.001 (i.e., C1 of FIG. 5), and when the space 28 between the one edge of the overlap and the pattern is about 0.01 μm, the fail rate thereof may be about 0.0005 (i.e., C2 of FIG. 5). Consequently, the fail rate of the space 28 between the one edge of the overlap and the pattern may decrease by about 0.0005.

When a margin in the unit of a minimum grid is added to the values of the rules associated with the metal pattern 22, the overall fail rate may be about 0.0006 (i.e., 0+about 0.0001+about 0.0005=about 0.0006). In other words, the overall fail rate may decrease about 0.0004 from the about 0.001 overall fail rate of the layout to which the margin has not yet been added. Because the overall fail rate decreased after the addition of the margin, operation S60 may be re-performed.

When the right edge of the metal pattern 22 moves to the right side in units of minimum grid, the pattern width 24 may increase from about 0.18 μm to about 0.19 μm. Since the pattern width 24 may be greater than about 0.15 μm, the pattern width 24 may be greater than the RR value (i.e., No. "1" of FIG. 4), and the fail rate of the pattern width 24 may be about 0 (i.e., W3 of FIG. 5).

The pattern space 26 may decrease from 0.14 μm to about 0.13 μm. Thus, when the pattern space 26 is about 0.14 μm, the fail rate thereof may be about 0.0001 (i.e., S2 of FIG. 5), and when the pattern space 26 is about 0.13 μm, the fail rate thereof may be about 0.0005 (i.e., S1 of FIG. 5). Consequently, the fail rate of the pattern space 26 may increase by about 0.0004.

The space 28 between the one edge of the overlap and the pattern may increase from about 0.01 μm to about 0.02 μm. When the space 28 between the one edge of the overlap and the pattern is about 0.01 μm, the fail rate thereof may be about 0.0005 (i.e., C2 of FIG. 5), and when the space 28 between the one edge of the overlap and the pattern is about 0.02 μm, the fail rate thereof may be about 0.00012 (i.e., C3 of FIG. 5).

Consequently, the fail rate of the space 28 between the one edge of the overlap and the pattern may decrease about 0.00038. When a margin in the unit of minimum grid is added to the values of the rules associated with the metal pattern 22, the overall fail rate may be about 0.00062 (i.e., 0+about 0.0005+about 0.00012=about 0.00062). The overall fail rate of about 0.00062 may increase about 0.00002 from the about 0.0006 overall fail rate of the layout to which the margin has not yet been added.

Because the overall fail rate of about 0.00062 increased from the about 0.0006 overall fail rate of the layout to which the margin has not yet been added, the computer processor or user may determine, as the margin to be added, an about 0.01 μm margin added before the initial increase of the overall fail rate, and may move to the next pattern in operation S70. The margin to improve the yield of the layout may be determined to be about 0.01 μm, and the computer processor or user may move to the next pattern in operation S70, and it may be determined whether the next pattern is the last one within the layout, in operation S80.

Operation S80 may determine that the next pattern is not the last one within the layout, and the computer processor or user may re-perform operation S10. When it is determined in operation S80 that the next pattern is the last one within the layout, the computer processor or user may conclude the method for improving the yield of the layout.

The sub-tables of FIG. 5 demonstrate that a failure rate of 0 ppb may be obtained for each of the rules of metal width, metal space, metal overlap of Contact and poly overlap of Contact if a suitable range is selected.

The method for improving the yield of a layout according to the present invention can also be embodied as computer readable codes on a computer readable recording medium. The computer readable recording medium may be any data storage device capable of storing data which can be thereafter read by a computer system. The computer readable recording medium may include, e.g., read-only memories (ROMs), random-access memories (RAMs), CD-ROMs, optical data storage devices, etc.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A recording medium having recorded thereon a computer program for programming a method for improving a yield of an integrated circuit layout, comprising:
  selecting a pattern that does not satisfy at least one of a plurality of rules of the integrated circuit layout;
  adding a margin to a predetermined value of the at least one of the plurality of rules of the selected pattern, based on a ground rule and a recommended rule of each of the plurality of rules;
  calculating an overall fail rate of the at least one of the plurality of rules that varies according to an addition of the margin;
  determining an adjusted margin to be added to the predetermined value based on the calculated overall fail rate; and
  adding the adjusted margin to the predetermined value and creating a new rule for the selected pattern.

2. The recording medium as claimed in claim 1, wherein the pattern is automatically selected by a computer processor or manually selected by a user.

3. The recording medium as claimed in claim 1, wherein the selecting of the pattern includes determining a range of the margin that is to be added to the predetermined value for the at least one of the plurality of rules of the selected pattern based on the ground rule and the recommended rule of each of the plurality of rules.

4. The recording medium as claimed in claim 1, wherein the calculating of the overall fail rate and determining of the adjusted margin includes:
  calculating a fail rate of the at least one of the plurality of rules that varies according to the addition of the margin;
  calculating the overall fail rate based on the fail rate of the at least one rule; and
  adding the margin in minimal grid units to the value of the at least one rule when the overall fail rate is decreased from an overall fail rate of the rules to which the margin has not yet been added, and determining as the adjusted margin to be added a margin added before an initial increase of the overall fail rate when the overall fail rate is increased from the overall fail rate of the rules to which the margin has not yet been added.

5. The recording medium as claimed in claim 4, wherein the method for improving the yield of the integrated circuit layout further includes repeatedly adding the margin in the minimal grid units to the value of the at least one rule until the overall fail rate initially increases.

6. The recording medium as claimed in claim 1, wherein each of the rules includes at least one of a pattern width, a pattern space, a space between one edge of an overlap and the pattern, a space between a poly region and the pattern, or a space between a poly region and an active region.

7. A recording medium having recorded thereon a computer program for programming a method for improving a yield of an integrated circuit layout, comprising:
  selecting a pattern that does not satisfy at least one of a plurality of rules within the integrated circuit layout;
  determining whether the rules associated with the selected pattern have a space to add a margin;
  determining a range of the margin to be added to the value of at least one rule;
  ascertaining types of rules associated with the selected pattern;
  differentiating the rules into rules having increasing values and rules having decreasing values with the margin is added to a rule that does not satisfy a recommended rule;
  adding the margin to a predetermined value of the at least one of the plurality of rules associated with selected pattern, based on a ground rule and the recommended rule of each of the plurality of rules;
  calculating an overall fail rate of at least one of the plurality of rules that varies according to the addition of the margin;
  determining an adjusted margin to be added to the predetermined value based on the calculated overall fail rate; and
  adding the adjusted margin to the predetermined value and creating a new rule for the selected pattern.

8. The recording medium as claimed in claim 7, wherein the pattern is automatically selected by a computer processor or manually selected by a user.

9. The recording medium as claimed in claim 7, wherein the selecting of the pattern includes determining a range of the margin to be added to the predetermined value for the at least one of the plurality of rules associated with the selected pattern based on the ground rule and the recommended rule of each of the plurality of rules.

10. The recording medium as claimed in claim 7, wherein the calculating of the overall fail rate and determining of the adjusted margin includes:
  calculating a fail rate of the at least one of the plurality of rules that varies according to the addition of the margin;
  calculating the overall fail rate based on the fail rate of the at least one rule; and
  adding the margin in minimal grid units to the value of the at least one rule when the overall fail rate is decreased from the overall fail rate of the rules to which the margin has not yet been added, and determining as the adjusted margin to be added a margin added before an initial increase of the overall fail rate when the overall fail rate is increased from the overall fail rate of the rules to which the margin has not yet been added.

11. The recording medium as claimed in claim 10, wherein the method for improving the yield of the integrated circuit layout further includes repeatedly adding the margin in the minimal grid units to the value of the at least one rule until the overall fail rate initially increases.

12. The recording medium as claimed in claim 7, wherein each of the rules is at least one of a pattern width, a pattern space, a space between one edge of an overlap and the pattern, a space between a poly region and the pattern, or a space between a poly region and an active region.

* * * * *